(12) United States Patent
Yamaura et al.

(10) Patent No.: US 11,056,417 B2
(45) Date of Patent: Jul. 6, 2021

(54) POWER CONVERSION APPARATUS

(71) Applicant: DENSO CORPORATION, Kariya (JP)

(72) Inventors: Satoshi Yamaura, Kariya (JP); Keisuke Mizushiri, Kariya (JP)

(73) Assignee: DENSO CORPORATION, Kariya (JP)

( * ) Notice: Subject to any disclaimer, the term of this patent is extended or adjusted under 35 U.S.C. 154(b) by 49 days.

(21) Appl. No.: 16/507,185

(22) Filed: Jul. 10, 2019

(65) Prior Publication Data

US 2020/0020609 A1  Jan. 16, 2020

(30) Foreign Application Priority Data

Jul. 11, 2018 (JP) .............................. JP2018-131434

(51) Int. Cl.
| | |
|---|---|
| *H01L 23/50* | (2006.01) |
| *H01L 23/473* | (2006.01) |
| *H01L 25/07* | (2006.01) |
| *H02M 7/00* | (2006.01) |
| *H02M 7/5387* | (2007.01) |
| *H02P 27/06* | (2006.01) |
| *H02P 5/74* | (2006.01) |

(52) U.S. Cl.
CPC ............ *H01L 23/473* (2013.01); *H01L 23/50* (2013.01); *H01L 25/073* (2013.01); *H02M 7/003* (2013.01); *H02M 7/5387* (2013.01); *H02P 5/74* (2013.01); *H02P 27/06* (2013.01)

(58) Field of Classification Search
CPC ...... H01L 23/473; H01L 23/50; H01L 25/073; H02M 7/003; H02M 7/5387; H02M 7/48; H02M 1/32; H02P 27/06; H02P 5/74; H05K 7/2089

See application file for complete search history.

(56) References Cited

U.S. PATENT DOCUMENTS

| | | | | |
|---|---|---|---|---|
| 2008/0239663 | A1* | 10/2008 | Yamamoto | ............ H01L 23/473 361/691 |
| 2013/0121052 | A1* | 5/2013 | Yamaura | ................ H02M 7/003 363/131 |

FOREIGN PATENT DOCUMENTS

JP   2011-135725 A   7/2011

* cited by examiner

*Primary Examiner* — Marcos D. Pizarro
*Assistant Examiner* — Sue Tang
(74) *Attorney, Agent, or Firm* — Oliff PLC

(57) ABSTRACT

A power conversion apparatus includes a plurality of semiconductor modules each having a semiconductor element integrated thereto; a plurality of cooling pipes that cools the semiconductor modules; a plurality of dummy modules with no integrated semiconductor element; and a pair of DC bus bars that constitute a current path between a DC power source and respective semiconductor modules. The semiconductor modules or the dummy modules, and the cooling pipes are alternately stacked to form a stack; m the plurality of semiconductor modules constitute an inverter circuit that converts a DC power supplied from the DC power source into a multi-phase AC power in which a plurality of types of AC outputs having mutually different phases are combined; and the dummy modules are each interposed between two semiconductor modules having mutually different phases of the AC outputs.

3 Claims, 15 Drawing Sheets

POWER CONVERSION APPARATUS

CROSS-REFERENCE TO RELATED APPLICATION

This application is based on and claims the benefit of priority from earlier Japanese Patent Application No. 2018-131434 filed Jul. 11, 2018, the description of which is incorporated herein by reference.

BACKGROUND

Technical Field

The present disclosure relates to a power conversion apparatus in which a plurality of semiconductor modules integrating semiconductor elements and a plurality of cooling pipe that cool the semiconductor modules are stacked.

Description of the Related Art

Conventionally, power conversion apparatuses are known. An example of a power conversion apparatus is provided with a stack structure in which a plurality of semiconductor modules integrating semiconductor elements, and a plurality of cooling pipes that cool the semiconductor modules are stacked.

SUMMARY

A power conversion apparatus according to a present disclosure includes a plurality of semiconductor modules each having a semiconductor element integrated thereto; a plurality of cooling pipes that cools the semiconductor modules; a plurality of dummy modules with no integrated semiconductor element; and a pair of DC bus bars that constitute a current path between a DC power source and respective semiconductor modules.

DETAILED DESCRIPTION OF THE PREFERRED EMBODIMENTS

First Embodiment

Figure 1:
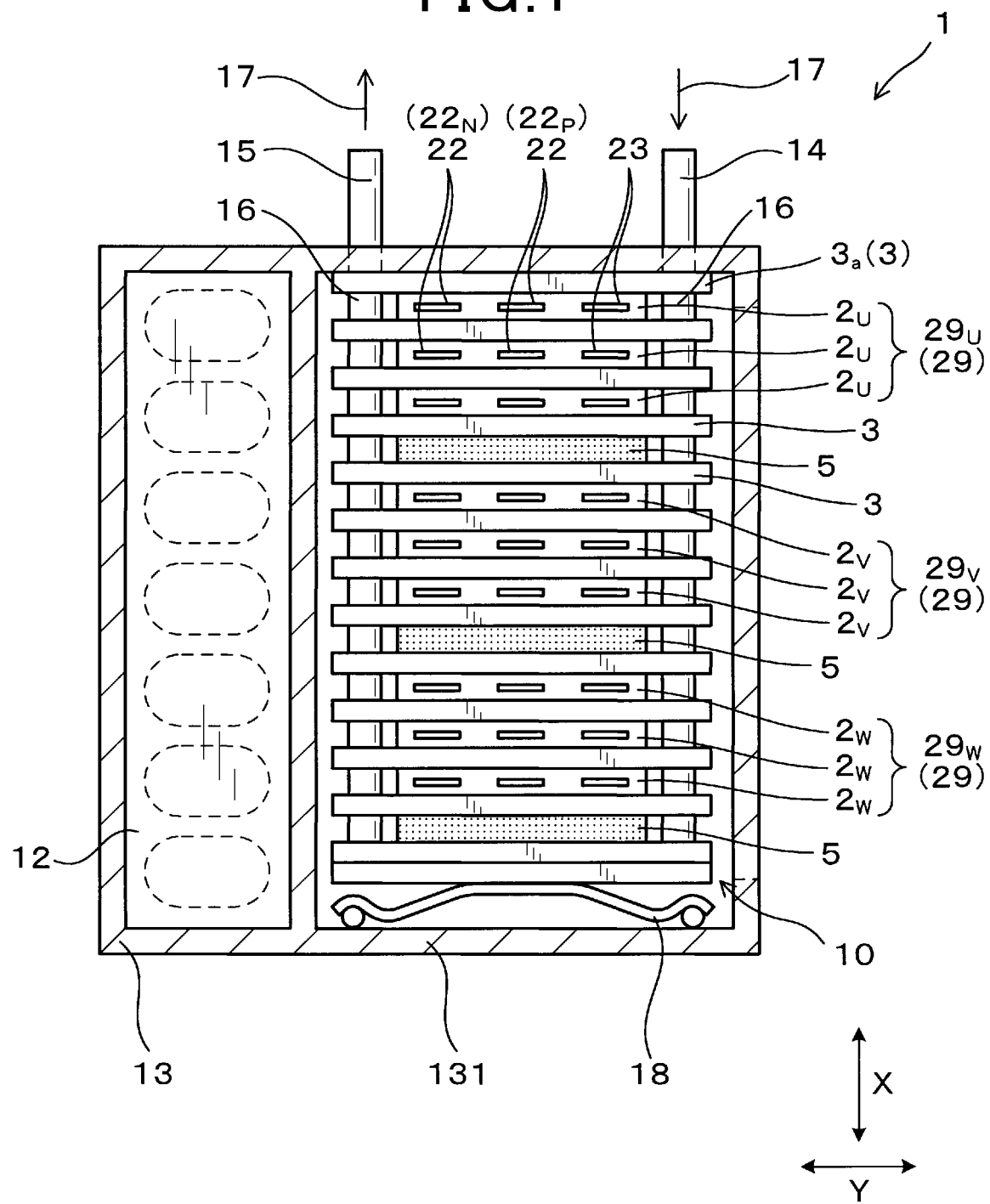
FIG. 1 is a diagram showing a cross-sectional view of a power conversion apparatus sectioned along a line I-I shown in FIG. 2 according to a first embodiment of the present disclosure.
Figure 2:
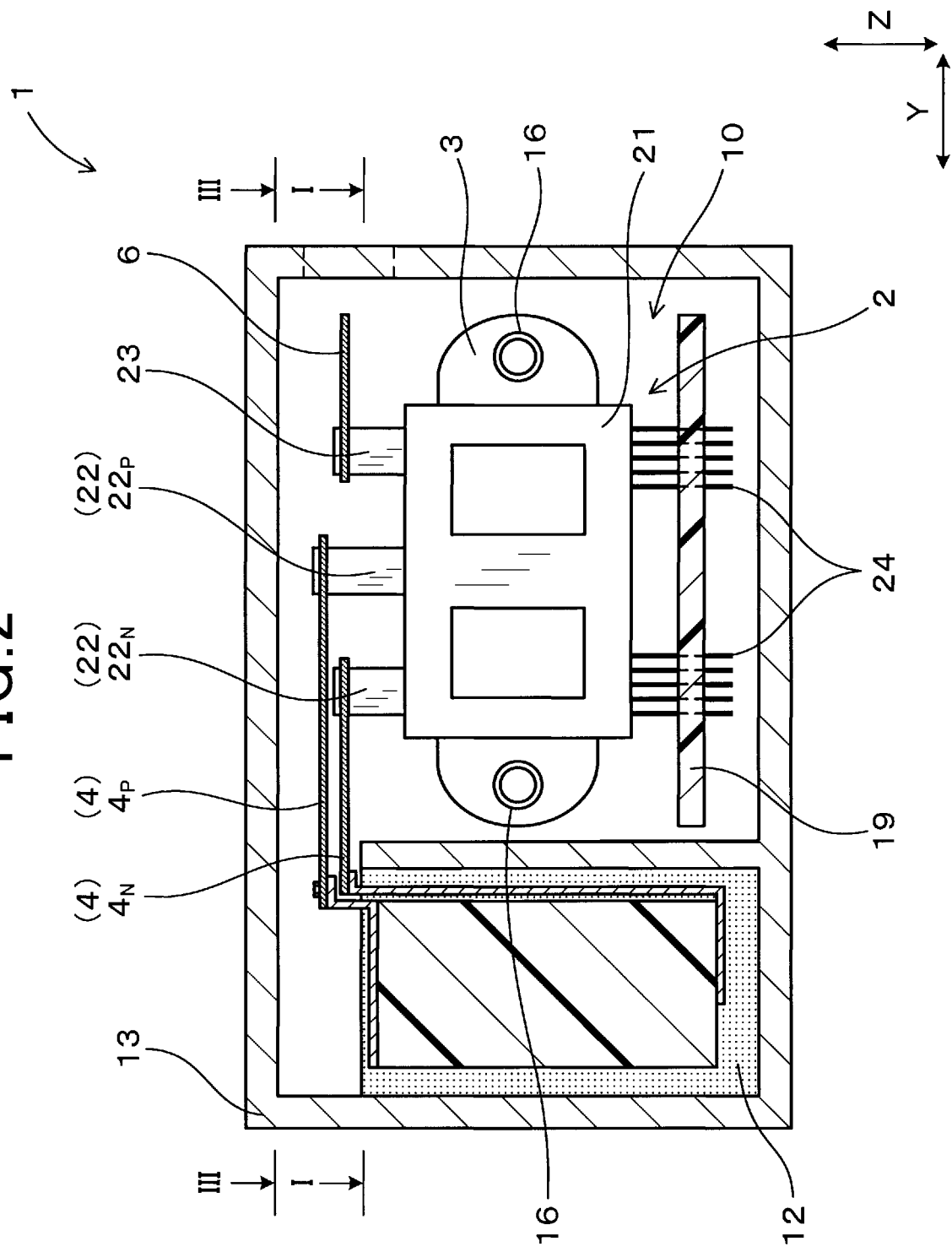
FIG. 2 is a diagram showing a cross-sectional view of the power conversion apparatus sectioned along a line II-II shown in FIG. 3 according to the first embodiment of the present disclosure.

With reference to FIGS. 1 to 6, a first embodiment of the above-described power conversion apparatus will be described. As shown in FIGS. 1 and 2, a power conversion apparatus 1 according to the first embodiment is provided with a plurality of semiconductor modules 20 (refer to FIG. 5) including semiconductor elements 20 (refer to FIG. 5). a plurality of cooling pipes 3, a plurality of dummy modules 5 including no semiconductor elements 20, and a pair of DC bus bar 4 ($4_P$, $4_n$). The cooling pipe 3 is provided to cool the semiconductor module 2. The DC bus bar 4 forms a current path between the DC power source 8 and each of the semiconductor modules 2.

Figure 5:
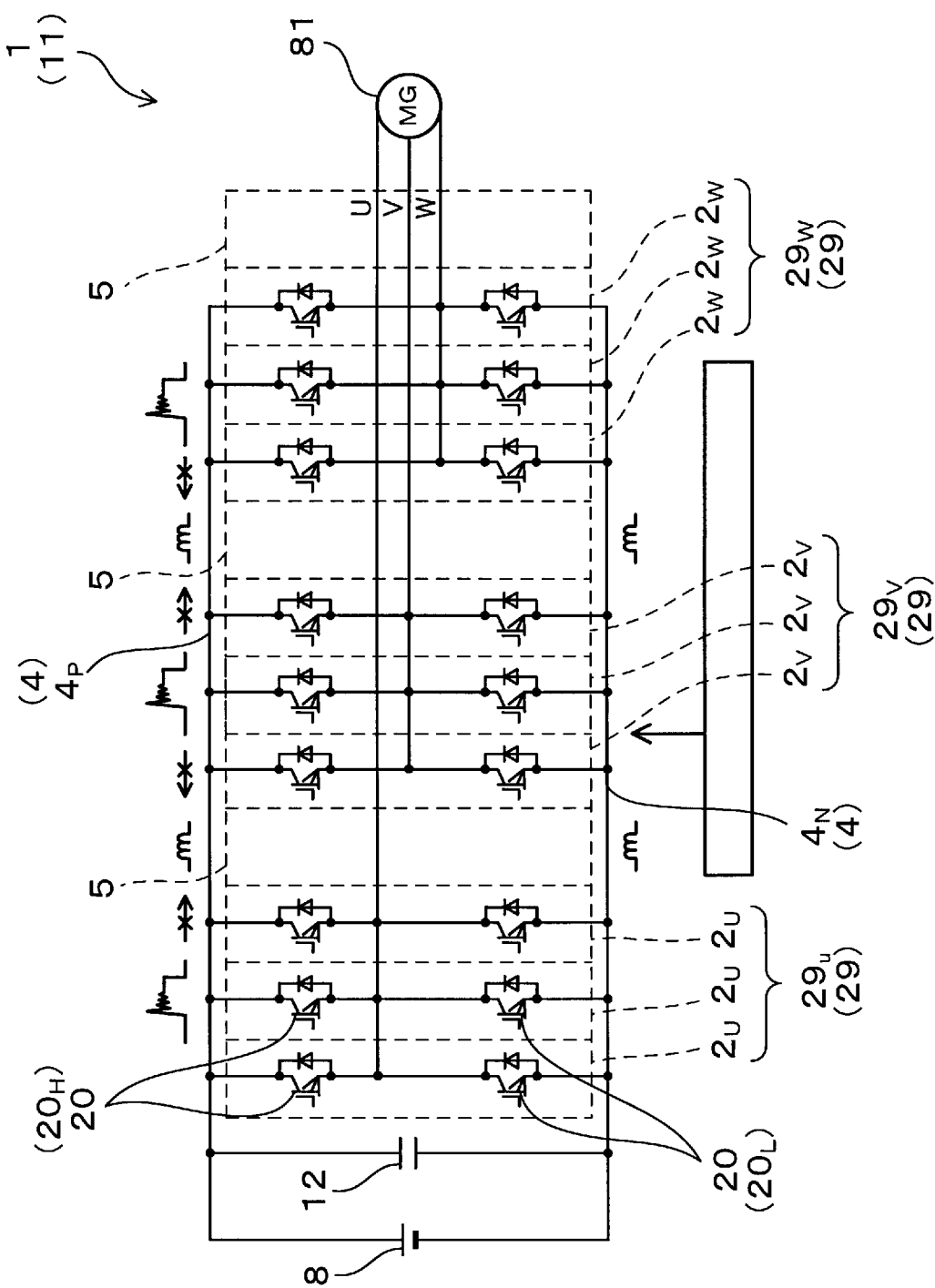
FIG. 5 is a circuit diagram of the power conversion apparatus according to the first embodiment.

As shown in FIG. 1, a stack 10 is configured such that a semiconductor module 2 or a dummy module 5 and a cooling pipe 3 are alternately stacked. Also, as shown in FIG. 5, according to the first embodiment, a plurality of semiconductor modules 2 constitute an inverter circuit 11. The inverter circuit 11 is configured to convert the DC power supplied from the DC power supply 8 to a multi-phase AC power in which a plurality of types of AC outputs having mutually different phases (that is, single phase AC power) are combined.

The dummy module 5 is interposed between two semiconductor modules 2 (between $2u$ and $2v$, and between $2v$ and $2w$) having mutually different phases of the AC outputs.

The power conversion apparatus 1 according to the first embodiment is configured as an on-vehicle power conversion apparatus to be mounted to an electric vehicle or a hybrid vehicle. According to the present embodiment, as shown in FIG. 5, a plurality of semiconductor modules 2 are utilized to constitute the inverter circuit 11. The inverter circuit 11 converts the DC power of the DC power source 8 to a three-phase AC power, thus driving an AC load 81 (three-phase AC motor), thereby having the above-vehicle travel.

As shown in FIG. 5, according to the present embodiment, three semiconductor modules 2 mutually connected in parallel are switch-operated. These three semiconductor modules 2 are configured to output a single AC output.

A plurality of semiconductor modules 2 which produce a single AC output constitute a semiconductor module group 29. According to the power conversion apparatus 1 of the present embodiment is provided with three semiconductor module group 29 including a U-phase semiconductor module group 29u, a V-phase semiconductor module group 29v, and a W-phase semiconductor module. The U-phase semiconductor module group 29u outputs a U-phase AC output. Similarly, the V-phase semiconductor module 29v outputs the V-phase AC output, and the W-phase semiconductor module 29w outputs the W-phase AC output.

As shown in FIG. 1, respective semiconductor modules that constitute a single semiconductor module group 29 are disposed to be adjacent to each other via a cooling pipe 3. A dummy module 5 is interposed between two semiconductor module groups 29. In other words, respective dummy modules 5 are interposed between the U-phase semiconductor module group 29u and the V-phase semiconductor module group 29v, and between the V-phase semiconductor module group 29v and the W-phase semiconductor module group 29w. Thus, the distance between two semiconductor modules 29 are extended in a stack direction (X-direction) of the stack 10.

As shown in FIG. 2, the semiconductor module 2 according to the present embodiment is provided with a body 21 integrating the semiconductor element 20 (refer to FIG. 5), a pair of DC terminals 22 ($22_P$, $22_N$), an AC terminal 23 and a control terminal 24. The DC terminals 22 is each connected to the DC bus bar 4, the control terminal 24 is connected to the control circuit 19. The control circuit 19 controls the switching operation of the semiconductor element 20. Also, the AC bus bar 6 is connected to the AC terminal 23. The multiphase AC power is supplied to the AC load 81 via this AC bus bar 6.

Further, a capacitor 12 is disposed in a case 13 of the power conversion apparatus 1. By using the capacitor 12, the DC voltage of the DC power source 8 is smoothed. The above-described DC bus bar is connected to the capacitor 12.

The DC bus bar 4 includes a positive electrode bus bar $4_P$ and a negative electrode bus bar $4_N$. The positive electrode bus bar $4_P$ is connected to the negative terminal $22_N$.

As shown in FIG. 1, an introduction pipe 14 introducing a refrigerant 17 and an output pipe 15 outputting the refrigerant 17 are connected to an end cooling pipe 3a positioned at one end in the X-direction among the plurality of cooling pipes 3. A connecting pipe 16 is interposed between two cooling pipes 3 being adjacent in the X direction. The connecting pipe 16 is provided at both end portions of the cooling pipe 13 in the longitudinal direction (Y direction). When the refrigerant 17 is introduced via the introduction pipe 14, the refrigerant 17 flows through all of the cooling pipes via the connecting pipe 16 and is outputted from the output pipe 15. Thus, respective semiconductor modules 2 are cooled.

A pressing member 18 (plate spring) is disposed between a wall portion 131 and the stack 10. The pressing member 18 is used to press the stack 10 in the X direction. Thus, the stack 10 is fixed to the case 13 while securing the contact pressure between the cooling pipe 3 and the semiconductor module 2.

Note that the above-described dummy module 5 is made of metal such as aluminum. The dummy module 5 is made of metal having high rigidity, whereby the pressing member 18 is not deformed even when the pressing member 18 applies pressure to the dummy module 5.

Figure 3:
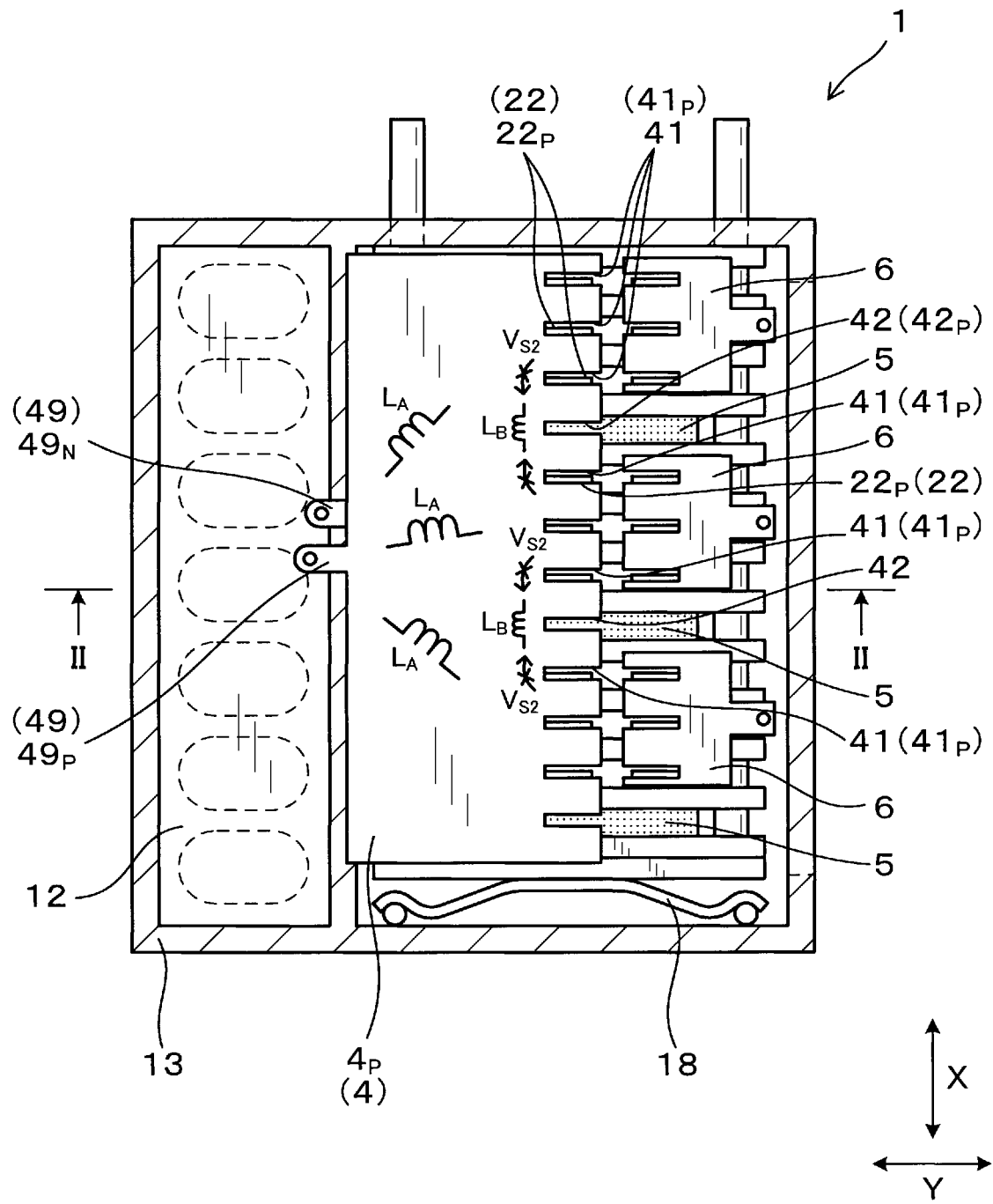
FIG. 3 is a diagram showing a cross-sectional view of the power conversion apparatus sectioned along a line III-III shown in FIG. 2.

Also, as shown in FIG. 3, a terminal cutout portion 41 ($41_p$) is formed at the positive electrode bus bar $4p$ to which the positive electrode $22_p$ is inserted and electrically connected. According to the present embodiment, the positive terminal $22p$ is welded to the positive bus bar $4_P$ in a state where the positive terminal $22_p$ is inserted to the terminal cutout portion $41_p$. Also, the positive bus bar $4_p$ includes a dummy cutout portion 42 ($42_p$) from which the dummy module 5 can be seen when viewed from a protrusion direction (Z direction) of the DC terminal 22. The dummy cutout portion 42 is formed between two terminal cutout portions 41 in the X direction. The dummy cutout portion 42 is formed in the same shape as that of the terminal cutout portion 41.

Figure 4:
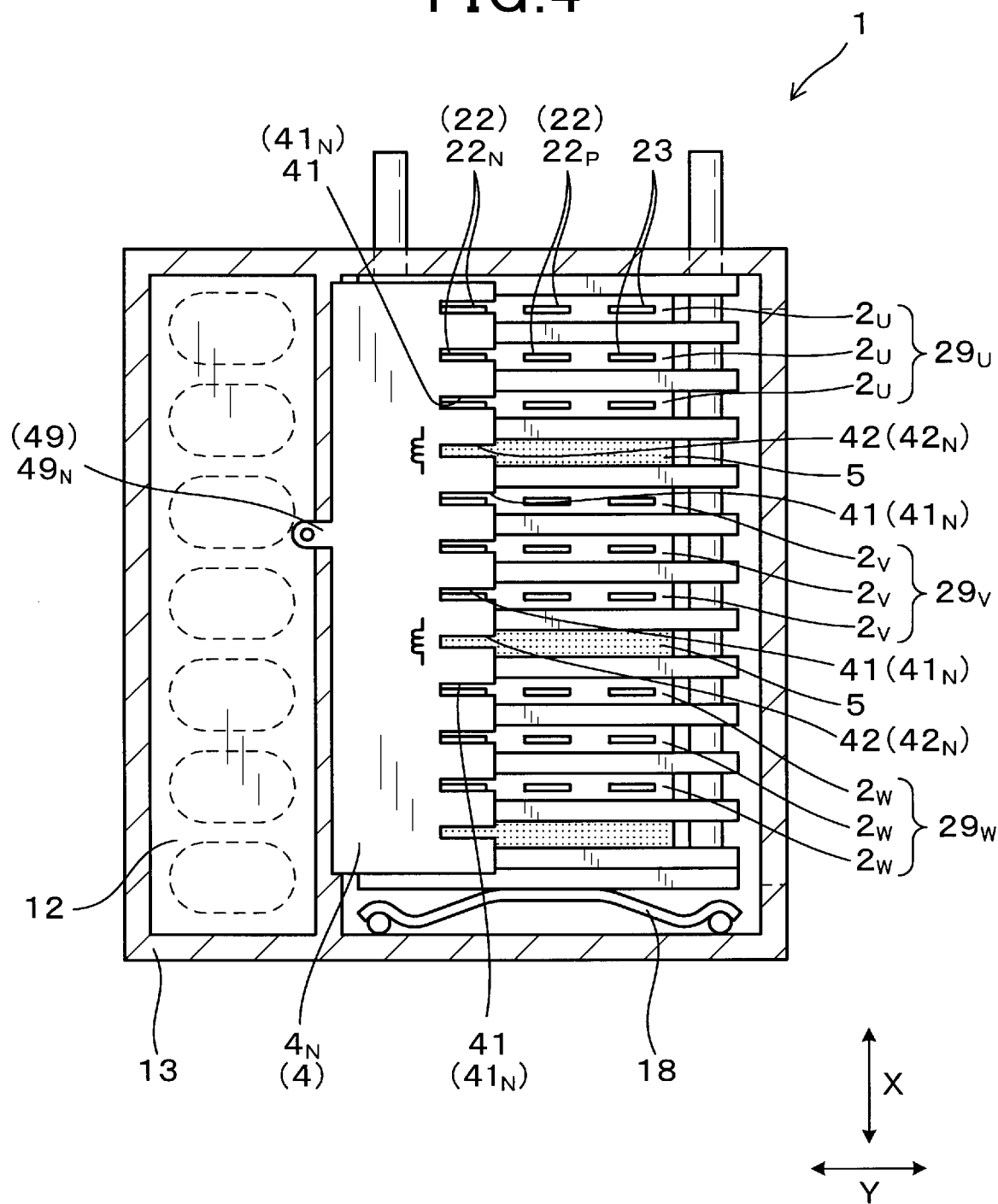
FIG. 4 is a diagram in which a positive electrode bus bar and a negative electrode bus bar are removed from FIG. 3.

As shown in FIG. 4, similar to the positive electrode bus bar $4_P$, the negative electrode bus bar $4_N$ is provided with a terminal cutout portion 41 ($41_N$) and a dummy cutout portion 42 ($42_N$).

As shown in FIGS. 3 and 4, each of the DC bus bars 4 ($4p$, $4_N$) includes capacitor connection portions 49 ($49_P$, $49_N$) to be connected to the capacitor 12. The respective capacitor connection portions 49 are provided in the center portion of the DC bus bar 4.

Figure 6:
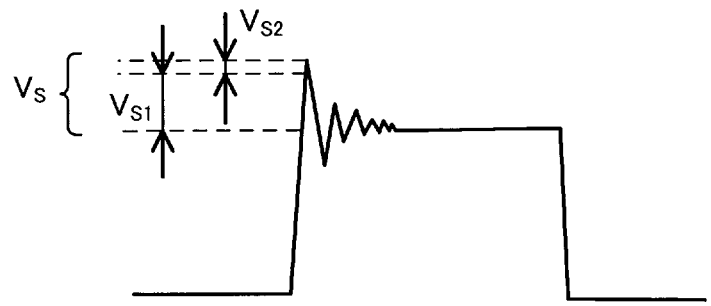
FIG. 6 is a diagram showing a waveform applied to a semiconductor element when performing a switching operation according to the first embodiment.

As shown in FIG. 3, a major inductance LA is parasitic on the DC bus bar 4 through the capacitor connection portions 49 and the terminal cutout portion 41. Further, an interphase inductance $L_B$ is parasitic between two semiconductor module groups 29. According to the present embodiment, since the above-described dummy modules 5 are inserted between the semiconductor module groups, the length between two semiconductor module groups 29 becomes longer so that relatively large inductance $L_B$ is being parasitic therebetween. When the semiconductor elements 20 are switched, as shown in FIG. 6, a surge voltage (i.e. self surge $V_{S1}$) applied to the semiconductor element 20 occurs because of the major inductance LA. Further, since the interphase inductance $L_B$ is parasitic on the DC bus bar, the self surge $V_{S1}$ is attenuated when being propagated from the DC bus bar 4 to the adjacent semiconductor module 2. Therefore, a large surge voltage (i.e. superimposed surge $V_{S2}$) is unlikely to propagate to each semiconductor module from adjacent semiconductor module 2.

Effects and advantages of the present embodiment will be described. As shown in FIG. 1, according to the present embodiment, the dummy module 5 is interposed between two semiconductor modules 2 having mutually different phases of the AC outputs (i.e. between semiconductor modules $2_U$ and $2_V$, and semiconductor modules $2_V$ and $2_W$). Hence, the respective semiconductor modules 20 can be prevented from being applied with large superimposed surge voltage $V_{S2}$. In other words, since the dummy module is interposed between two semiconductor modules 20, a distance between the two semiconductor modules 2 having mutually different phases of the AC outputs can be extended. Hence, as shown in FIG. 3, the distance of a path on the DC bus bar 4 along which the superimposed surge voltage $V_{S2}$ propagates becomes longer such that the interphase inductance $L_B$ being parasitic on this DC bus bar 4 reduces the superimposed surge voltage $V_{S2}$ can be reduced. Therefore, the respective semiconductor elements 20 can be prevented from being applied with large superimposed surge voltage $V_{S2}$.

Figure 16:
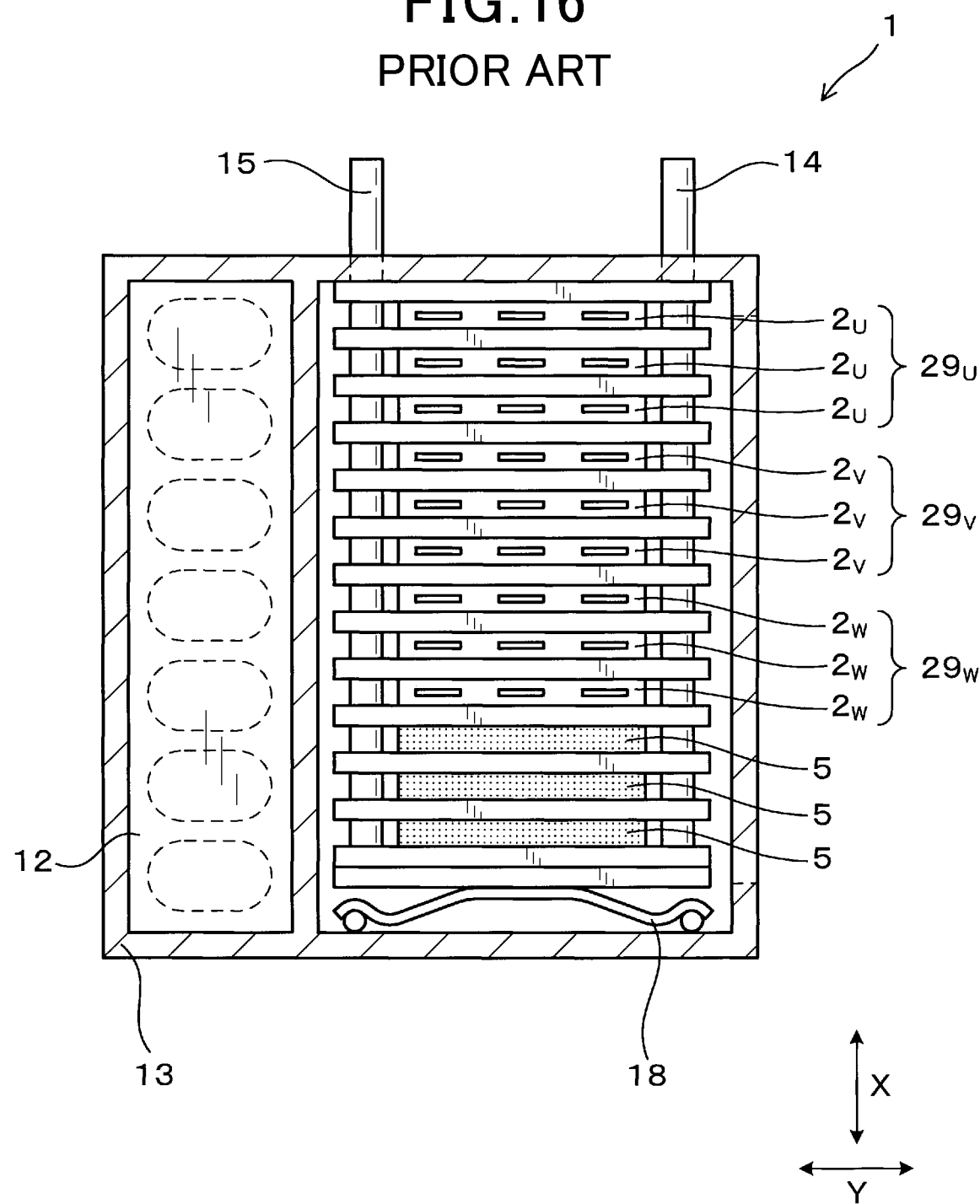
FIG. 16 is a diagram showing a cross-sectional view of a power conversion apparatus according to a comparative example.
Figure 17:
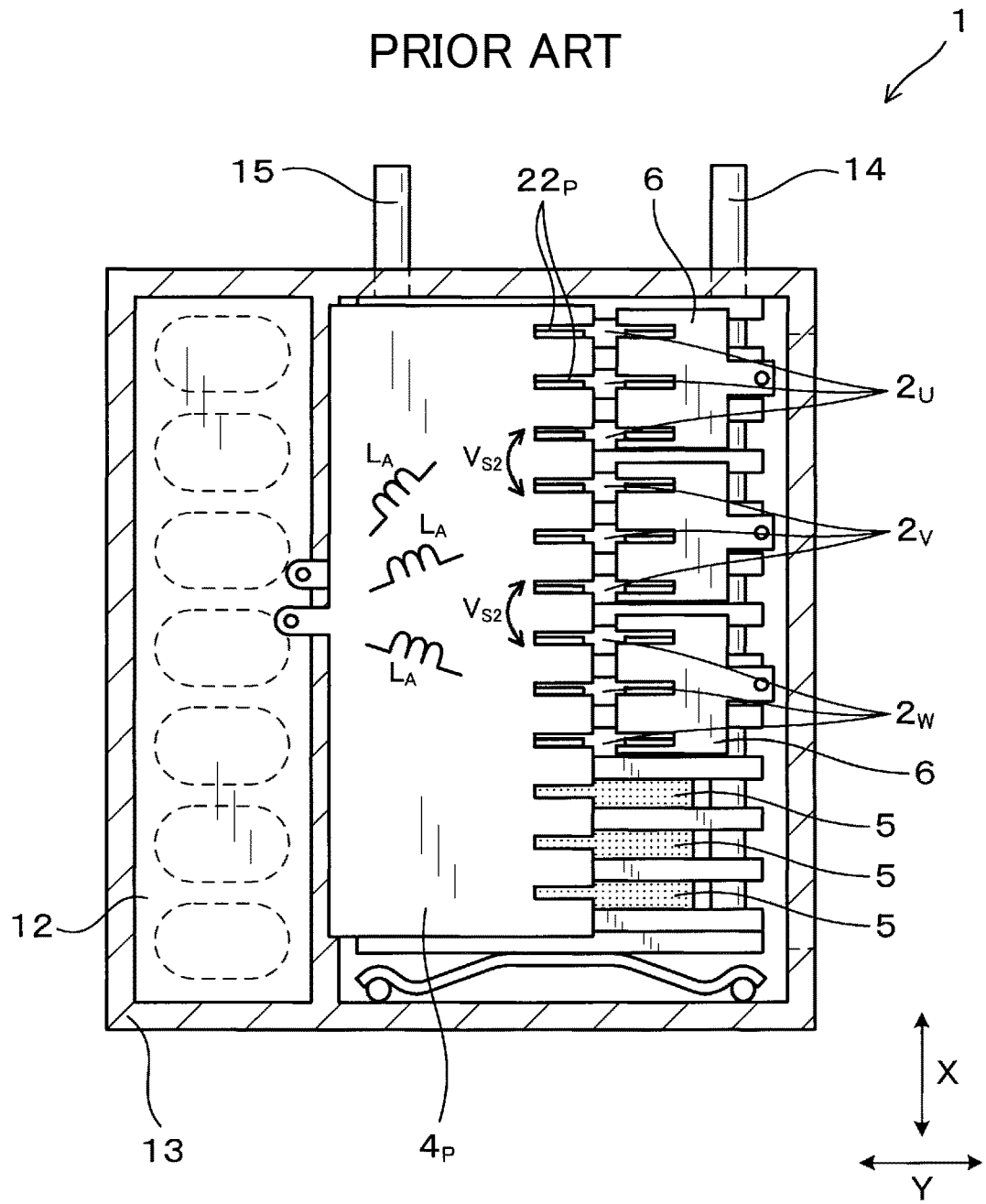
FIG. 17 is a diagram showing the power conversion apparatus shown in FIG. 16 in which a DC bus bar and an AC bus bar are attached.
Figure 18:
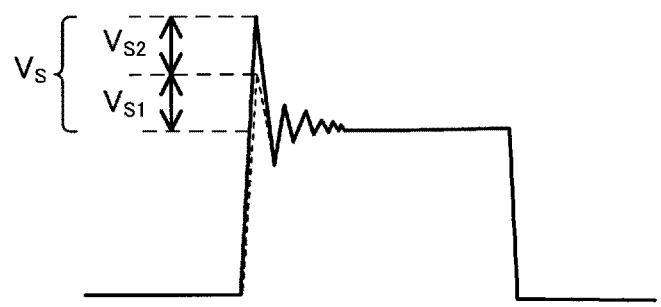
FIG. 18 is a diagram showing a waveform of a voltage applied to a semiconductor element when performing a switching operation according to a comparative example.

According to the conventional power conversion apparatus 1, as shown in FIG. 16, the dummy module 5 is not provided between two semiconductor modules 2 having mutually different phases. Hence, as shown in FIG. 17, each interval between the two semiconductor modules 2 having mutually different phases is narrow, and large interphase inductance $L_B$ is unlikely to be parasitic on the DC bus bar 4. Accordingly, the superimposed surge voltage $V_{S2}$ is unlikely to attenuate and large superimposed surge voltage $V_{S2}$ is likely to propagate from adjacent semiconductor modules 2. Therefore, as shown in FIG. 18, when being switched, both of the self surge voltage $V_{S1}$ and large superimposed surge voltage $V_{S2}$ may be applied to the semiconductor element 20. For this reason, a semiconductor element having high breakdown voltage is required to be utilized or the switching speed is required to be lowered in order to reduce the surge $V_S$ (i.e. sum of the self surge $V_{S1}$ and the superimposed surge $V_{S2}$). However, according to the present disclosure, as shown in FIG. 1, since the dummy module 5 is interposed between two semiconductor modules 2 having mutually different phases, the distance between these two semiconductor modules 2 can be longer. Therefore, the distance of the path on the bus bar 4 along which the superimposed surge voltage $V_{S2}$ propagates becomes longer, so that the superimposed surge voltage $V_{S2}$ is likely to attenuate because of the inductance on the DC bus bar 4 (i.e. interphase inductance $L_B$). Accordingly, as shown in FIG. 6, respective semiconductor elements 20 can be prevented from being applied with large superimposed surge voltage from other semiconductor elements.

Further, according to the present embodiment, as shown in FIG. 5, a plurality of semiconductor modules 2 constitutes the semiconductor module groups 29. Then, the plurality of semiconductor modules 2 that constitute the semiconductor module groups 29 simultaneously perform the switching operation to output a single AC output. Moreover, as shown in FIG. 1, a dummy module 5 is interposed between two semiconductor module groups 29. Thus, since the plurality of semiconductor modules 2 are simultaneously switched, a large amount of current can be flown as a whole power conversion apparatus 1 even if a small amount of current flows through respective semiconductor module 2. When a large amount of current is required to flow, large surge voltage is likely to occur during the switching operation. However, according to the present embodiment, since the dummy module 5 is provided, a large superimposed surge voltage $V_{S2}$ can be prevented from being applied to the respective semiconductor elements 20. As a result, a large amount of current can be flown while the surge voltage Vs is suppressed.

Also, as shown in FIG. 3, the DC bus bar 4 is provided with the terminal cutout portion 41 to which the DC terminal 22 is inserted to be electrically connected, and the dummy cutout portion 42. The dummy cutout portion 42 is formed between two terminal cutout portions 41 in the X direction. Thus, when the superimposed surge voltage $V_{S2}$ propagates to other semiconductor module 2, the superimposed surge voltage $V_{S2}$ passes around the dummy cutout portion 42, whereby a propagation distance of the superimposed surge voltage $V_{S2}$ can be increased. Accordingly, the interphase inductance $L_B$ can be large so that the superimposed surge voltage $V_{S2}$ can readily be suppressed.

Further, according to the present embodiment, the size and the shape are substantially the same between the dummy module 5 and the body 21 of the semiconductor module 2. Accordingly, an insertion position of the dummy module 5 can readily be changed. As will be described later, depending on the power consumption of the AC load 81, the number of semiconductor modules 1 may be changed (refer to FIG. 13), and then the insertion position of the dummy module 5 may be changed. According to the present embodiment, since the size and the shape are substantially the same between the dummy module 5 and the body 21 of the semiconductor module 2, these positions can readily be changed.

As described, according to the present embodiment, a power conversion apparatus capable of suppressing a large superimposed surge voltage applied to the semiconductor elements can be provided.

In the following embodiments, portions having the same reference numbers as those in the first embodiment indicate the same components in the first embodiment unless otherwise specified.

Second Embodiment

Figure 7:
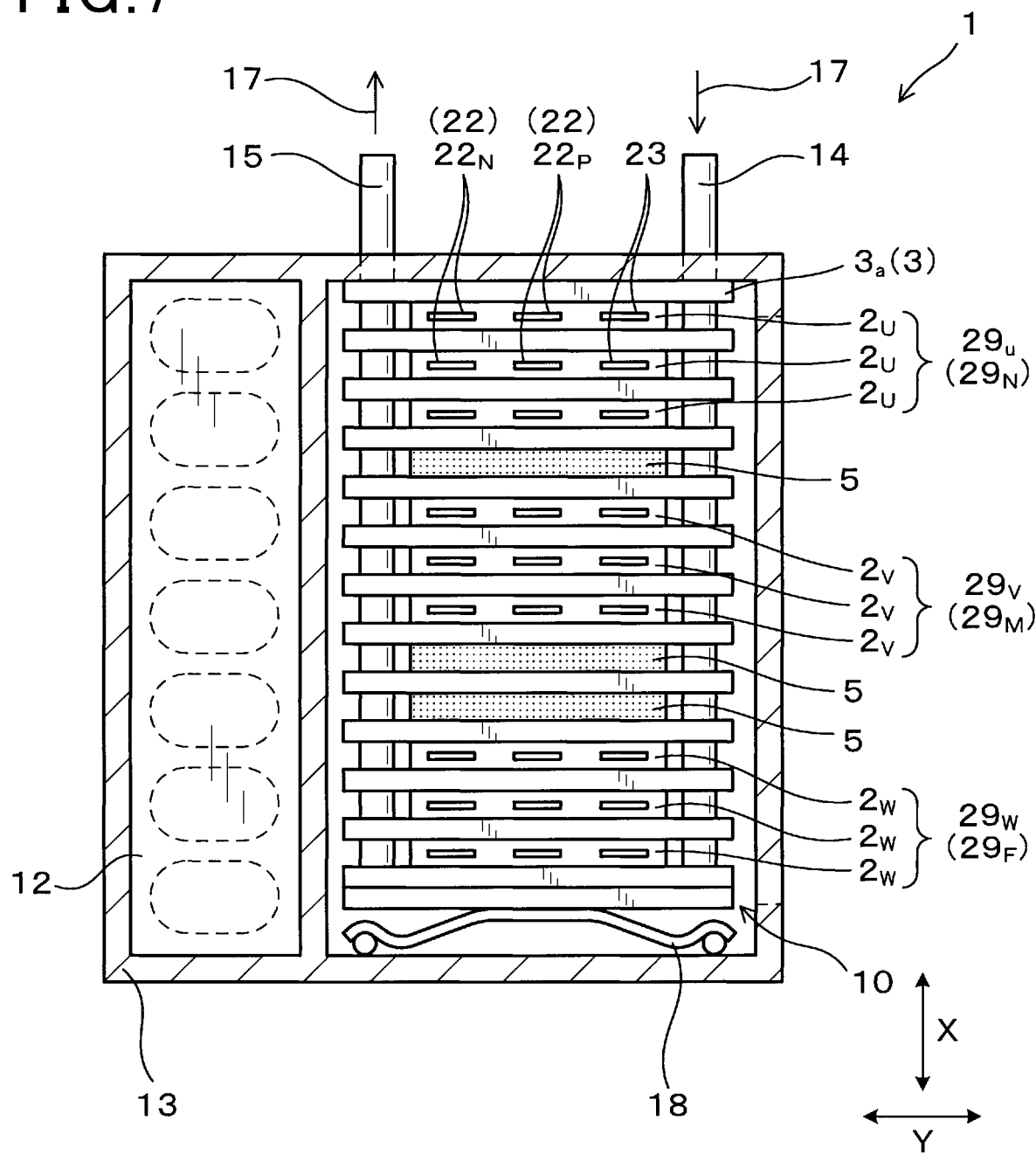
FIG. 7 is a cross-sectional view showing a power conversion apparatus according to a second embodiment.
Figure 8:
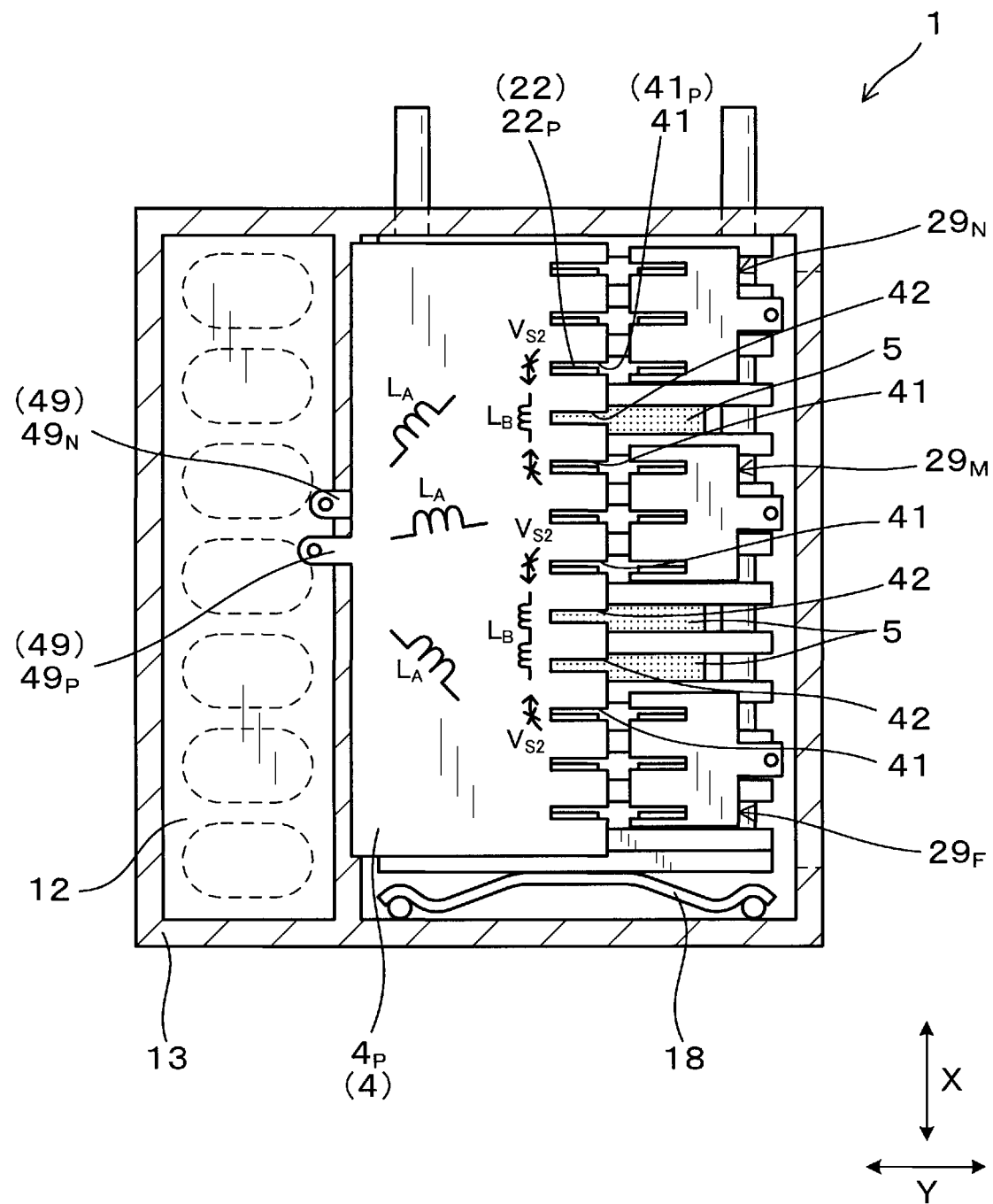
FIG. 8 is a diagram showing the power conversion apparatus in which a DC bus bar and an AC bus bar are attached.

The present embodiment is an example in which the number of dummy modules 5 are changed. According to the present embodiment, as shown in FIG. 7, two dummy modules 5 are interposed between two semiconductor module groups 29 ($29_F$, $29_M$). Hence, as shown in FIG. 8, the distance of the propagation path on the DC bus bar 4 along which the superimposed surge voltage $V_{S2}$ propagates can be longer so that the interphase inductance $L_B$ being parasitic on the DC bus bar 4 can be larger. Accordingly, superimposed surge voltage $V_{S2}$ applied to these semiconductor module groups ($29_F$, $29_M$) can be more suppressed.

More specifically, according to the second embodiment, as shown in FIG. 7, two dummy modules 5 are interposed between the farthest semiconductor module group $29_F$ (W phase semiconductor module group 29W according to the present embodiment) located at the farthest position with respect to the end portion cooling pipe 3 in the X direction, and an intermediate semiconductor module group $29_M$ (V phase semiconductor module group $29_V$ according to the present embodiment) located closer to the end portion cooling pipe $3_a$ side than the farthest semiconductor module group $29_F$ is, among the plurality of semiconductor groups 29.

Thus, the interval between the intermediate semiconductor module group $29_M$ and the farthest semiconductor module group $29_F$ can be longer. Therefore, as shown in FIG. 8, the distance of the propagation path between these semiconductor module groups $29_M$ and $29_F$ along which the superimposed surge voltage $V_{S2}$ propagates, becomes longer so that the superimposed surge voltage $V_{S2}$ can be more suppressed. Accordingly, the semiconductor elements 20 included in the intermediate semiconductor module groups $29_M$ and the farthest semiconductor module group $29_F$ can be prevented from being applied with large superimposed surge voltage $V_{S2}$. Especially, since the farthest semiconductor module groups $29_F$ is located to be adjacent to only the intermediate semiconductor module group $29_M$, large superimposed surge voltage $V_{S2}$ is unlikely to propagate to the farthest semiconductor module group $29_F$.

Figure 9:
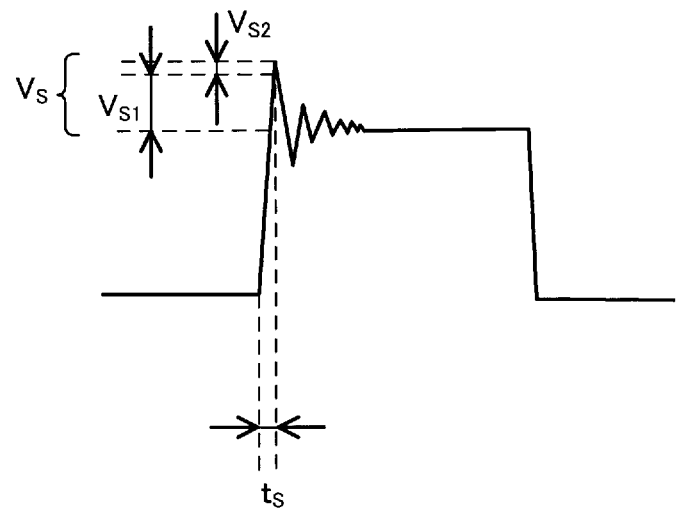
FIG. 9 is a diagram showing a waveform of a semiconductor module included in an intermediate semiconductor module group when performing a switching operation according to the second embodiment.
Figure 10:
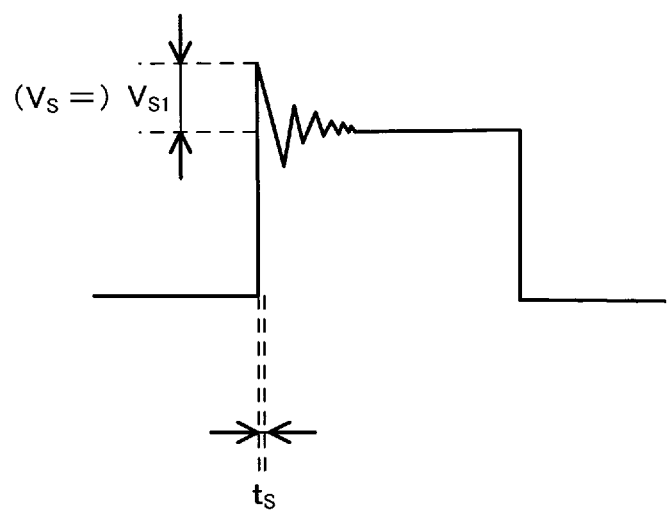
FIG. 10 is a diagram showing a waveform of a semiconductor module included in a farthest semiconductor module group when performing a switching operation according to the second embodiment.

Therefore, the switching speed (refer to FIG. 10) of the semiconductor elements 20 included in the farthest semiconductor module group $29_F$ can be faster than the switching sped (refer to FIG. 9) of the semiconductor elements 20 included in the intermediate semiconductor module group $29_M$. When setting the switching speed to be faster, larger self surge voltage $V_{S1}$ is applied to the semiconductor elements 20 included in the farthest semiconductor module group $29_F$. However, since this semiconductor module 2 is unlikely to be applied with the superimposed surge voltage $V_{S2}$, the total surge voltage Vs (=$V_{S1}$+$V_{S2}$) may not exceed the breakdown voltage of the semiconductor elements 20. Moreover, since the farthest semiconductor module group $29_F$ is located at the farthest position with respect to the end portion cooling pipe $3_a$ (i.e. cooling pipe 3 that connects the introduction pipe 14 and the output pipe 15), the pressure drop of the refrigerant 17 is large so that the refrigerant 17 is difficult to flow. Accordingly, the farthest semiconductor module group $29_F$ has low cooling efficiency but the switching speed is faster. Hence, the switching loss can be reduced. As a result, the temperature of respective semiconductor modules 2 included in the farthest semiconductor module group $29_F$ can be prevented from being increased.

Also, as shown in FIG. 8, according to the present embodiment, in the DC bus bar 4, two dummy cutout portions 42 are formed at a portion between two semiconductor module groups $29_M$ and $29_F$ when viewed from the Z-direction. With this configuration, the superimposed surge voltage $V_{S2}$ passes around the two dummy cutout portions 42, whereby the propagation distance of the superimposed surge voltage $V_{S2}$ can be longer. Hence, the superimposed surge voltage $V_{S2}$ can be more attenuated. Other than the above-described configuration, the same effects and advantages as those in the first embodiment can be obtained according to the present embodiment.

According to the present embodiment, two dummy modules 5 are interposed between two semiconductor module groups 29 ($29_M$, $29_F$). However, the present disclosure is not limited thereto, but three or more dummy modules can be interposed therebetween.

Third Embodiment

Figure 11:
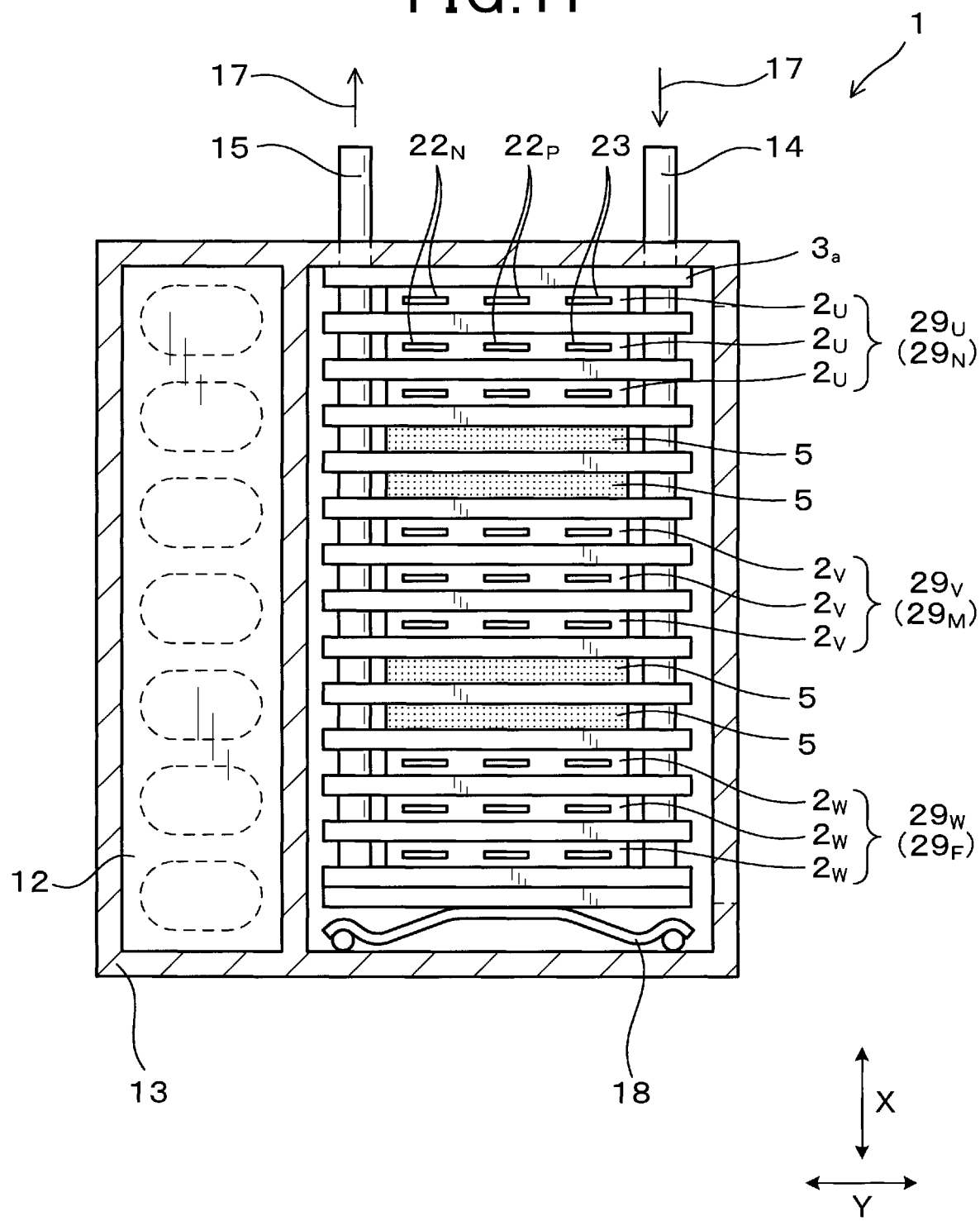
FIG. 11 is a diagram showing a cross-sectional view of a power conversion apparatus according to a third embodiment.

The third embodiment is an example in which the number of dummy modules 5 is changed. According to the present embodiment, as shown in FIG. 11, two dummy modules 5 are interposed between the closest semiconductor module group $29_N$ located at the closest position with respect the end portion cooling pipe $3_a$ (U-phase semiconductor module group $29_u$) and the intermediate semiconductor module group $29_M$. Also, similar to the second embodiment, two dummy modules 5 are interposed between the intermediate module group $29_M$ and the farthest semiconductor module group $29_F$.

Figure 12:
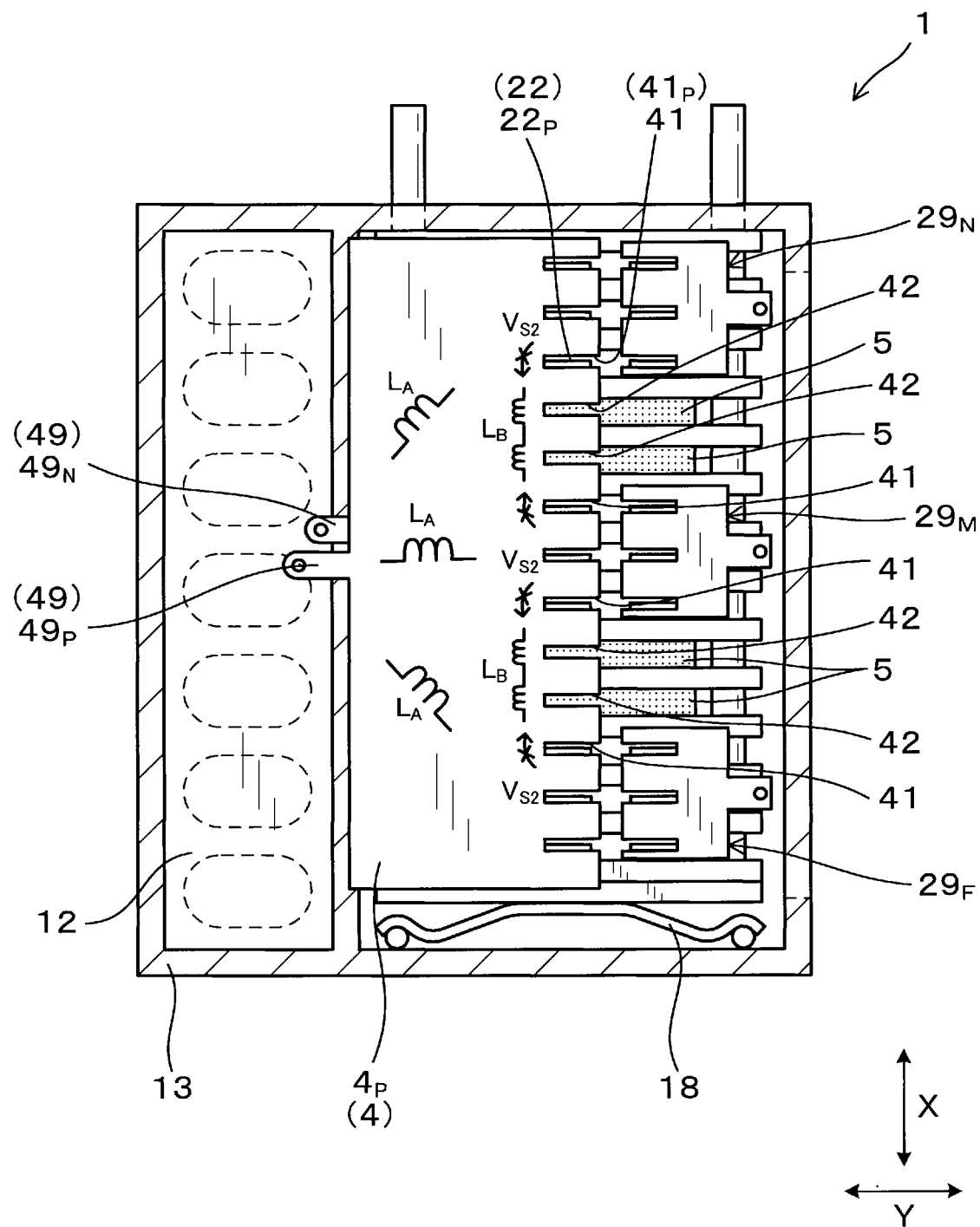
FIG. 12 is a diagram showing the power conversion apparatus shown in FIG. 11 in which a DC bus bar and an AC bus bar are attached.

Thus, as shown in FIG. 12, since the distance between the closest semiconductor module group $29_N$ and the intermediate semiconductor module group $29_M$ can be extended, the distance of a path between these semiconductor module group $29_N$ and the intermediate semiconductor module group $29_M$ along which the superimposed surge voltage $V_{S2}$ propagates can be longer. Hence, the interphase inductance $L_B$ therebetween can be large so that the superimposed surge voltage $V_{S2}$ can be more reduced. Also, similar to the second embodiment, the superimposed surge voltage $V_{S2}$ is unlikely to propagate between the intermediate semiconductor module group $29_M$ and the farthest semiconductor module group $29_F$. Hence, the superimposed surge voltage $V_{S2}$ propagated from other semiconductor modules 2 can be suppressed for all of the semiconductor modules 2.

Also, as shown in FIG. 12, two dummy cutout portions 42 are formed at a portion between the closest semiconductor module group $29_N$ and the intermediate semiconductor module group $29_M$. Thus, the superimposed surge voltage $V_{S2}$ passes around the two dummy cutout portions 42 between the two semiconductor module groups $29_N$ and $29_M$. Hence, the propagation distance of the superimposed surge voltage $V_{S2}$ between the semiconductor module group $29_N$ and $29_M$ can be longer so that the superimposed surge voltage Vs2 can be effectively suppressed. Other than the above-described configuration, the same effects and advantages as those in the first embodiment can be obtained according to the present embodiment.

Fourth Embodiment

Figure 13:
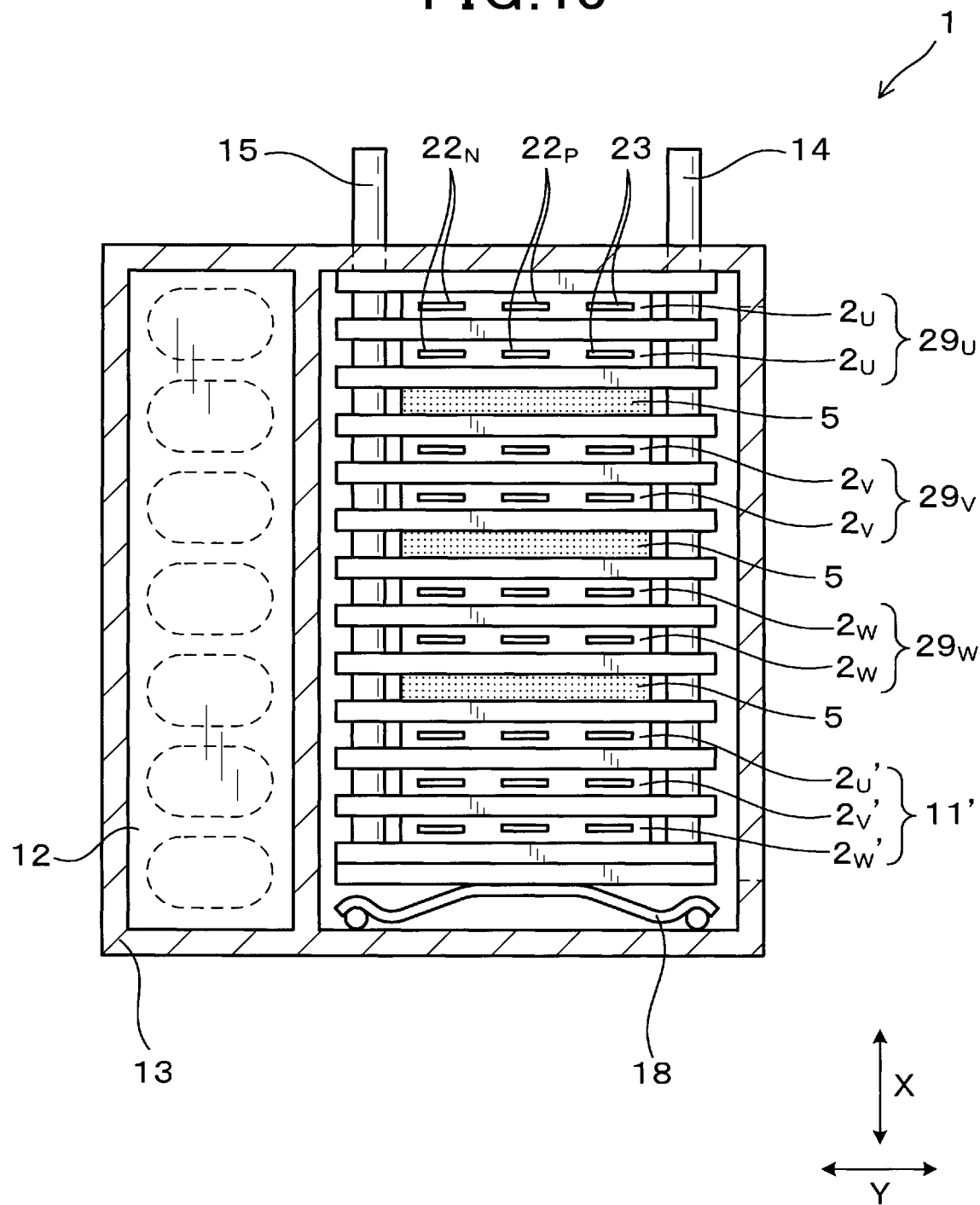
FIG. 13 is a diagram showing a cross-sectional view of a power conversion apparatus according to a fourth embodiment.
Figure 14:
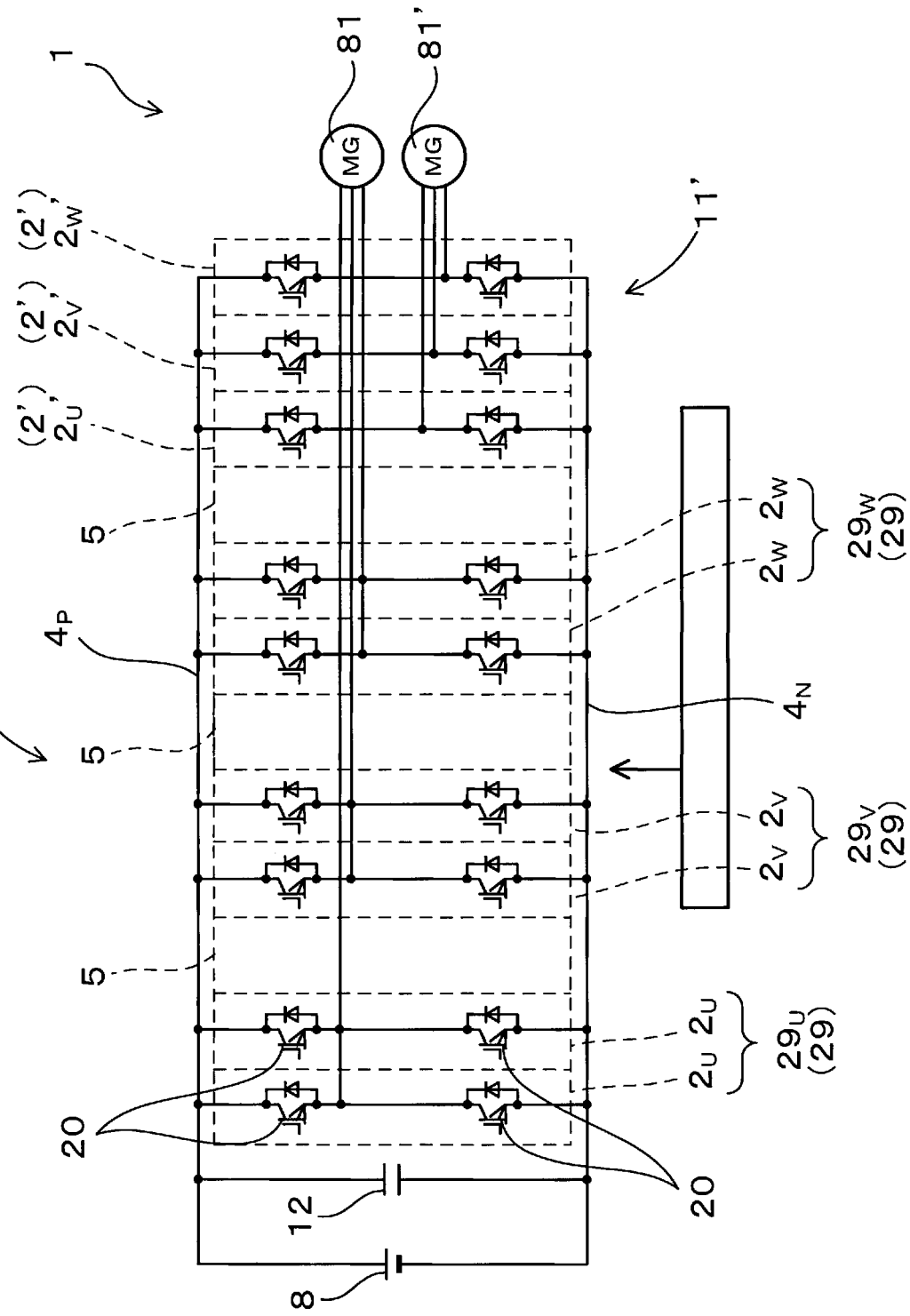
FIG. 14 is a circuit diagram showing of the power conversion apparatus according to the fourth embodiment.

The fourth embodiment is an example in which the number of semiconductor modules 2 that constitutes the semiconductor module group 29 is changed. As shown in FIGS. 13 and 14, according to the present embodiment, two semiconductor modules 2 are used to constitute the semiconductor module group 29 ($29_U$, $29_V$, $29_W$). In the case where the power consumption of the AC load 81 is low, two semiconductor modules 2 is used to constitutes the semiconductor module group 29. Moreover, one dummy module 5 is interposed between respective semiconductor module groups 29.

According to the power conversion apparatus 1 of the present embodiment is provided with auxiliary semiconductor modules 2' ($2_U$', $2_V$', $2_W$'). These auxiliary semiconductor modules 2' drive an auxiliary AC load 81'. The auxiliary AC load 81' may be, for example, a rear motor of the vehicle. Other than the above-described configuration, the same effects and advantages as those in the first embodiment can be obtained according to the present embodiment.

Fifth Embodiment

Figure 15:
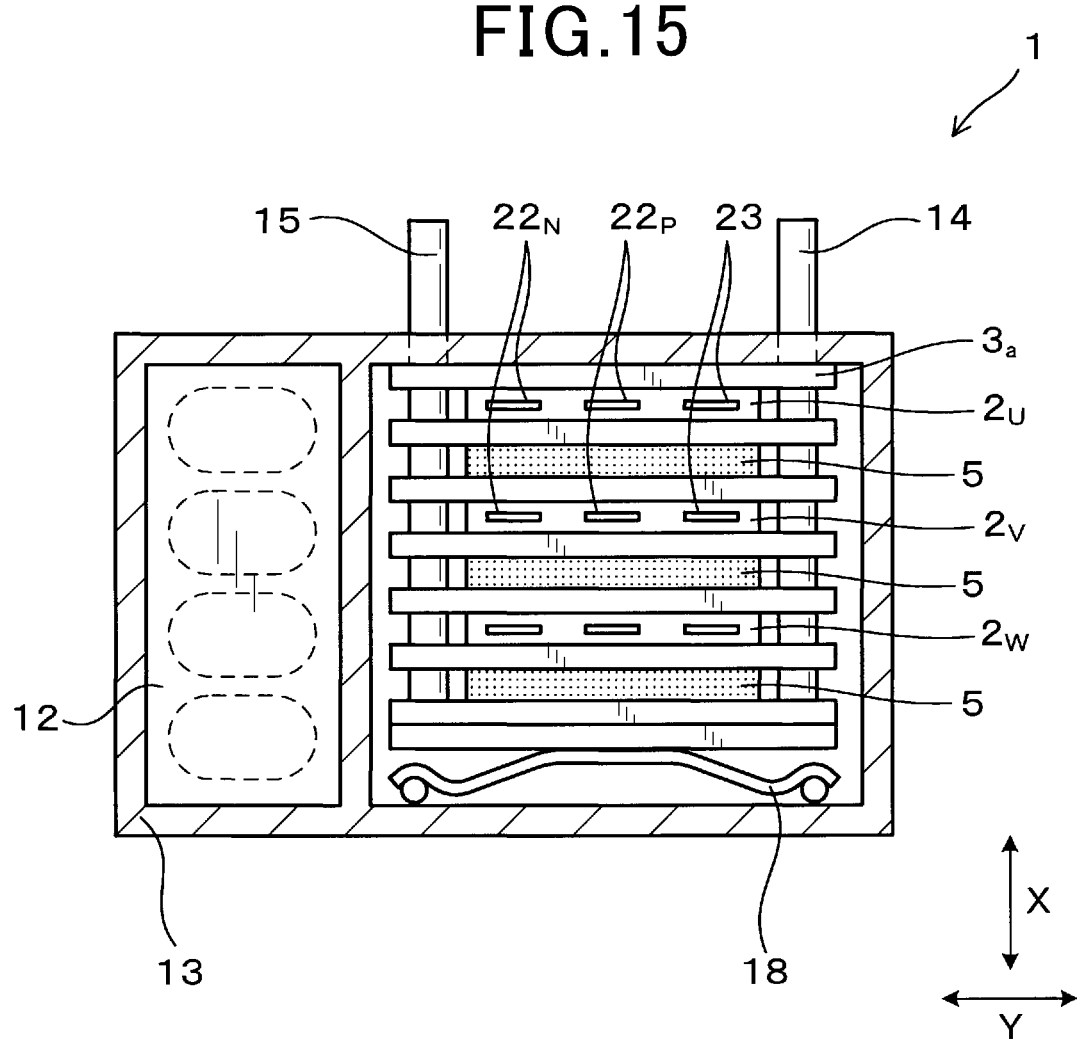
FIG. 15 is a diagram showing a cross-sectional view of a power conversion apparatus according to a fifth embodiment.

The fourth embodiment is an example in which the number of semiconductor modules 2 that constitutes the semiconductor module group 29 is changed. As shown in FIG. 15, the power conversion apparatus 1 according to the present embodiment is provided with three semiconductor modules 2. The dummy module 5 is interposed between the respective semiconductor modules 2. The above-described three semiconductor modules 2 constitute the inverter circuit 11 that converts the DC power into the three-phase AC power. Other than the above-described configuration, the same effects and advantages as those in the first embodiment can be obtained according to the present embodiment.

The present disclosure is not limited to the above-described embodiments, but can be modified in various manners without departing from the spirit of the present disclosure.

A power conversion apparatus of the present disclosure is described so far. Conventional type of power conversion apparatus will be described as follows. According to a conventional type of power conversion apparatus, a DC bus bar is connected to respective semiconductor modules. The semiconductor modules are connected to a DC power source via the bus bar. This conventional type of the power conversion apparatus is configured to operate the semiconductor elements to perform a switching operation, thereby converting the DC power supplied by the DC power source to a multiphase AC power.

However, according to the above-mentioned power conversion apparatus, significant surge voltage may be applied to the semiconductor elements when being switched. That is, when the semiconductor switching elements are switched, due to parasitic inductance in the DC bus bar, the surge voltage (also referred to as self surge voltage) applied to the semiconductor elements occurs at each semiconductor element. Further, this self surge voltage may propagate on the DC bus bar and may be applied to a semiconductor element in another phase (also referred to as superimposed surge voltage). According to the above-described power conversion apparatus, when controlling a plurality of semiconductor elements to perform switching operation, the above-described self surge voltage and superimposed surge voltage propagated from other semiconductor elements may be simultaneously applied to one semiconductor element. Hence, even when such surge voltages are simultaneously applied to a semiconductor element, in order to avoid damaging the semiconductor element, it is required to use semiconductor elements having high breakdown voltage.

The present disclosure has been achieved in light of the above-described circumstances and provides a power conversion apparatus capable of suppressing large surge voltage applied to semiconductor elements.

As a first aspect of the present disclosure is a power conversion apparatus including a plurality of semiconductor modules each having a semiconductor element integrated thereto; a plurality of cooling pipes that cool the semiconductor modules; a plurality of dummy modules with no integrated semiconductor element; and a pair of DC bus bars that constitute a current path between a DC power source and respective semiconductor modules. The semiconductor modules or the dummy modules, and the cooling pipes are alternately stacked to form a stack; the plurality of semiconductor modules constitutes an inverter circuit that converts a DC power supplied from the DC power source into a multi-phase AC power in which a plurality of types of AC outputs having mutually different phases are combined; and the dummy modules are each interposed between two semiconductor modules having mutually different phases of the AC outputs.

In the above-described power conversion apparatus, the above-described dummy module is interposed between two semiconductor modules having mutually different phases of the AC output. Hence, superimposed surge voltage applied to the semiconductor elements can be suppressed. In other words, when the above-described dummy module is provided, an interval between the two semiconductor modules having mutually different phases of the AC output can be extended. Hence, the distance of a propagation path on the DC bus bar along which the superimposed surge voltage becomes longer so that the superimposed surge voltage is suppressed due to a parasitic inductance on the DC bus bar. Accordingly, application of a large surge voltage from other semiconductor elements to each semiconductor element can be suppressed.

According to the above-described aspects, a power conversion apparatus capable of suppressing a large superimposed surge voltage applied to the semiconductor elements is described. It should be noted that the bracket reference signs in this column or claims indicate correspondence to specific means in the embodiments described later, and do not limit the technical scope of the present disclosure.

What is claimed is:

1. A power conversion apparatus comprising:
    a plurality of semiconductor modules each having a semiconductor element integrated therewith, each of the semiconductor modules being provided with a body that integrates the semiconductor element and a pair of DC terminals protruding from the body, each of the DC terminals being connected to the body;
    a plurality of cooling pipes configured to cool the semiconductor modules;
    a plurality of dummy modules with no integrated semiconductor element;
    a pair of DC bus bars that constitute a current path between a DC power source and respective semiconductor modules;
    a stack of the semiconductor modules or the dummy modules, and the cooling pipes, alternately stacked;
    two terminal cutout portions of one of the DC bus bars, two of the DC terminals being respectively inserted and electrically connected to the two terminal cutout portions;
    a dummy cutout portion of the one DC bus bar, the dummy cutout portion being disposed between the two terminal cutout portions in a stack direction of the stack; and
    an inverter circuit composed of the plurality of semiconductor modules, the inverter circuit being configured to convert DC power supplied from the DC power source into multi-phase AC power in which a plurality of types of AC outputs having mutually different phases are combined,
    wherein the dummy modules are each interposed between two semiconductor modules having mutually different phases of the AC outputs.

2. The power conversion apparatus according to claim 1, wherein
    the plurality of semiconductor modules are configured to simultaneously perform a switching operation to output a single AC output;
    the plurality of semiconductor modules outputting the single AC output constitute a semiconductor module group;
    respective semiconductor modules included in the semiconductor module group are disposed to be adjacent via the cooling pipes; and
    the dummy modules are interposed between two semiconductor modules located to be mutually adjacent in the stack direction of the stack.

3. The power conversion apparatus according to claim 2, wherein
    a plurality of the dummy modules are interposed between the two semiconductor modules.

* * * * *